United States Patent
Tsai et al.

(10) Patent No.: US 11,888,487 B2
(45) Date of Patent: Jan. 30, 2024

(54) PHASE INTERPOLATION DEVICE AND MULTI-PHASE CLOCK GENERATION DEVICE

(71) Applicant: REALTEK SEMICONDUCTOR CORP., Hsinchu (TW)

(72) Inventors: Tsung-Han Tsai, Hsinchu (TW); Peng-Fei Lin, Hsinchu (TW); Kuo-Wei Chi, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 18/071,794

(22) Filed: Nov. 30, 2022

(65) Prior Publication Data

US 2023/0170890 A1 Jun. 1, 2023

(30) Foreign Application Priority Data

Dec. 1, 2021 (TW) ................................. 110144763

(51) Int. Cl.
*H03K 5/135* (2006.01)
*G06F 1/08* (2006.01)
*H03K 5/131* (2014.01)
*H03K 5/00* (2006.01)

(52) U.S. Cl.
CPC .............. *H03K 5/135* (2013.01); *G06F 1/08* (2013.01); *H03K 5/131* (2013.01); *H03K 2005/00058* (2013.01)

(58) Field of Classification Search
None
See application file for complete search history.

(56) References Cited

U.S. PATENT DOCUMENTS

| 8,502,586 | B1 * | 8/2013 | Naviasky | H04L 7/0337 327/239 |
| 2013/0088274 | A1 | 4/2013 | Gu | |
| 2023/0102952 | A1 * | 3/2023 | Tsai | H03K 5/05 327/170 |

OTHER PUBLICATIONS

Athanasios Stefanou, Emman Ouil Bochoridis. "Design of a Low-Power Phase Interpolator for Multi-Standard Transceiver PHYs," 2019 IEEE.

(Continued)

*Primary Examiner* — Cassandra F Cox
(74) *Attorney, Agent, or Firm* — Li & Cai Intellectual Property (USA) Office

(57) ABSTRACT

A phase interpolation device and a multi-phase clock generation device are provided. The phase interpolation device includes a digital controller circuit and a phase interpolator that includes a capacitor and circuit branches, which are controlled by the digital controller circuit to generate an n-th phase clock of N phase clocks between first and second input clocks. When the n-th phase clock is generated, the digital controller circuit controls, in response to appearances of rising edges of the first input clock, the circuit branches to charge the capacitor using (N−n+1)×M ones of the first current source, and controls, in response to appearances of rising edges of the second input clock, the circuit branches to use N×M ones of the first current source to charge the capacitor. N, M, n are integers.

10 Claims, 8 Drawing Sheets

(56) References Cited

OTHER PUBLICATIONS

Mohamed Benyahia, Jean Batiste Moulard, Franck Badets, Anouar Mestassi, Thomas Finateu, Lionel Vogt, Fabrice Boissieres. "A Digitally Controlled 5GHz Analog Phase Interpolator with 10GHz LC PLL," 2007 IEEE, pp. 130-135.

Satoshi Kumaki, Abul Hasan Johari, Takeshi Matsubara, Isamu Hayashi, Hiroki Ishikuro. "A 0.5V 6-bit Scalable Phase Interpolator," 2010 IEEE, pp. 1019-1022.

* cited by examiner

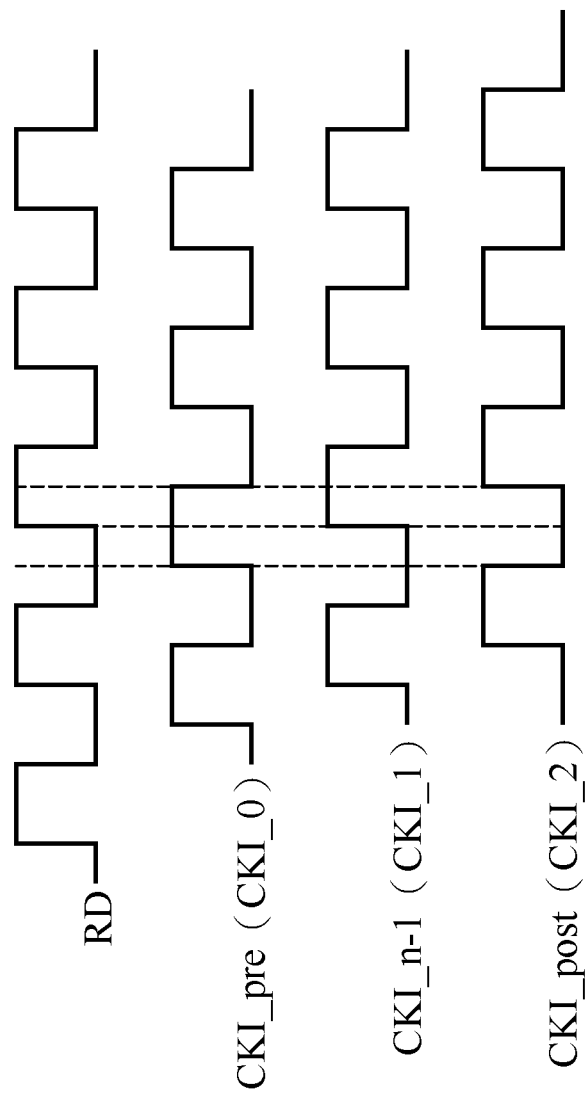

PHASE INTERPOLATION DEVICE AND MULTI-PHASE CLOCK GENERATION DEVICE

CROSS-REFERENCE TO RELATED PATENT APPLICATION

This application claims the benefit of priority to Taiwan Patent Application No. 110144763, filed on Dec. 1, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to phase interpolation technology, and more particularly, to a phase interpolation device and a multi-phase clock generation device.

BACKGROUND OF THE DISCLOSURE

A phase interpolator can generate clocks of different phases that are interpolated between two input clocks, so that phase interpolators are widely used in multi-phase clock generation devices. For example, assuming that two input clocks have a phase time difference of T, the multi-phase clock generation device can use N phase interpolators to generate N phase clocks interpolated between the two input clocks. Ideally, the phase time difference between any two adjacent ones of the N phase clocks is T/N. However, in practice, the phase time difference may be affected by process variation, voltage drift, and temperature changes. Therefore, one of important issues in the art has become how to generate a phase clock with high linearity.

SUMMARY OF THE DISCLOSURE

In response to the above-referenced technical inadequacies, one aspect of the present disclosure is to provide a phase interpolation device, which includes a digital controller circuit and a phase interpolator. The phase interpolator is electrically coupled to the digital controller circuit and includes a plurality of circuit branches. The plurality of circuit branches is electrically coupled to an output node and controlled by the digital controller circuit to generate an n-th phase clock of N phase clocks between a first input clock and a second input clock, and the n-th phase clock serves as an output clock of the phase interpolation device. N is an integer greater than 1, and n is an integer from 1 to N. Each of the plurality of circuit branches includes a first current source and a second current source electrically coupled in series between a supply voltage and a ground voltage, the output node is electrically coupled between the first current source and the second current source, and the phase interpolator further includes a capacitor electrically coupled between the output node and the ground voltage. A quantity of the plurality of circuit branches is greater than or equal to N×M, where M is an integer greater than or equal to 1. When the digital controller circuit controls the plurality of circuit branches to generate the n-th phase clock, the digital controller circuit controls, in response to appearances of rising edges of the first input clock, the plurality of circuit branches to charge the capacitor using (N−n+1)×M ones of the first current source, and the digital controller circuit controls, in response to appearances of rising edges of the second input clock, the plurality of circuit branches to use N×M ones of the first current source to charge the capacitor.

In another aspect, the present disclosure provides a multi-phase clock generation device, which includes N clock generating circuits. The N clock generating circuits are respectively configured to generate N phase clocks interpolated between a first input clock and a second input clock through N output nodes. An n-th clock generating circuit of the N clock generating circuits is configured to generate an n-th phase clock of the N phase clocks through an n-th output node of the N output nodes, and the n-th clock generating circuit includes a digital controller circuit and a phase interpolator. The phase interpolator is electrically coupled to the digital controller circuit and includes a plurality of circuit branches. The plurality of circuit branches of the n-th clock generating circuit are electrically coupled to the n-th output node and controlled by the digital controller circuit of the n-th clock generating circuit to generate the n-th phase clock on the n-th output node. N is an integer greater than 1, and n is an integer from 1 to N. In the n-th clock generating circuit, each of the plurality of circuit branches includes a first current source and a second current source electrically coupled in series between a supply voltage and a ground voltage, the n-th output node is electrically coupled between the first current source and the second current source, and the phase interpolator further includes a capacitor electrically coupled between the n-th output node and the ground voltage. In the n-th clock generating circuit, a quantity of the plurality of circuit branches is greater than or equal to N×M, M is an integer greater than or equal to 1, and when the digital controller circuit controlling the plurality of circuit branches to generate the n-th phase clock, the digital controller circuit controls, in response to appearances of rising edges of the first input clock, the plurality of circuit branches to charge the capacitor with (N−n+1)×M ones of the first current source, and the digital controller circuit controls, in response to appearances of rising edges of the second input clock, the plurality of circuit branches to charge the capacitor with N×M ones of the first current source.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIGS. 5A to 5C are schematic diagrams portraying a calibration circuit determining whether an n-th phase clock has a position offset with respect to known reference data according to one embodiment of the present disclosure;

DETAILED DESCRIPTION OF THE EXEMPLARY EMBODIMENTS

Figure 1:
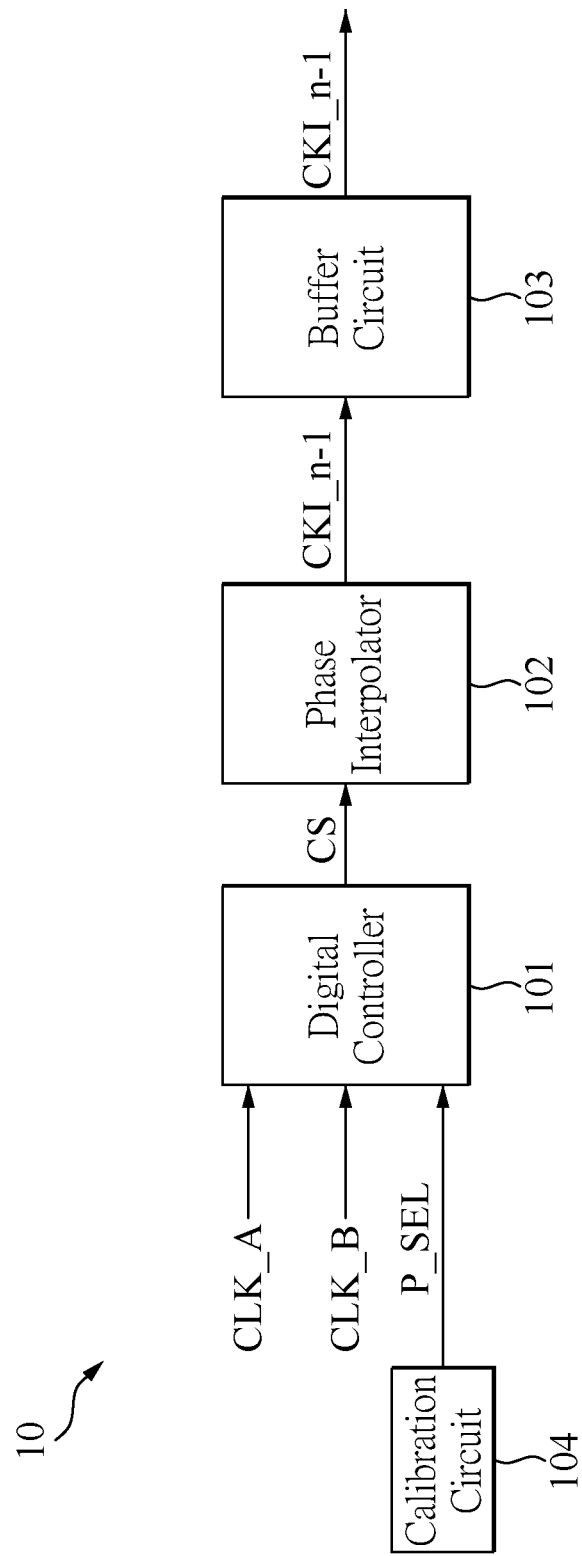
FIG. 1 is a schematic diagram of a phase interpolation device according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
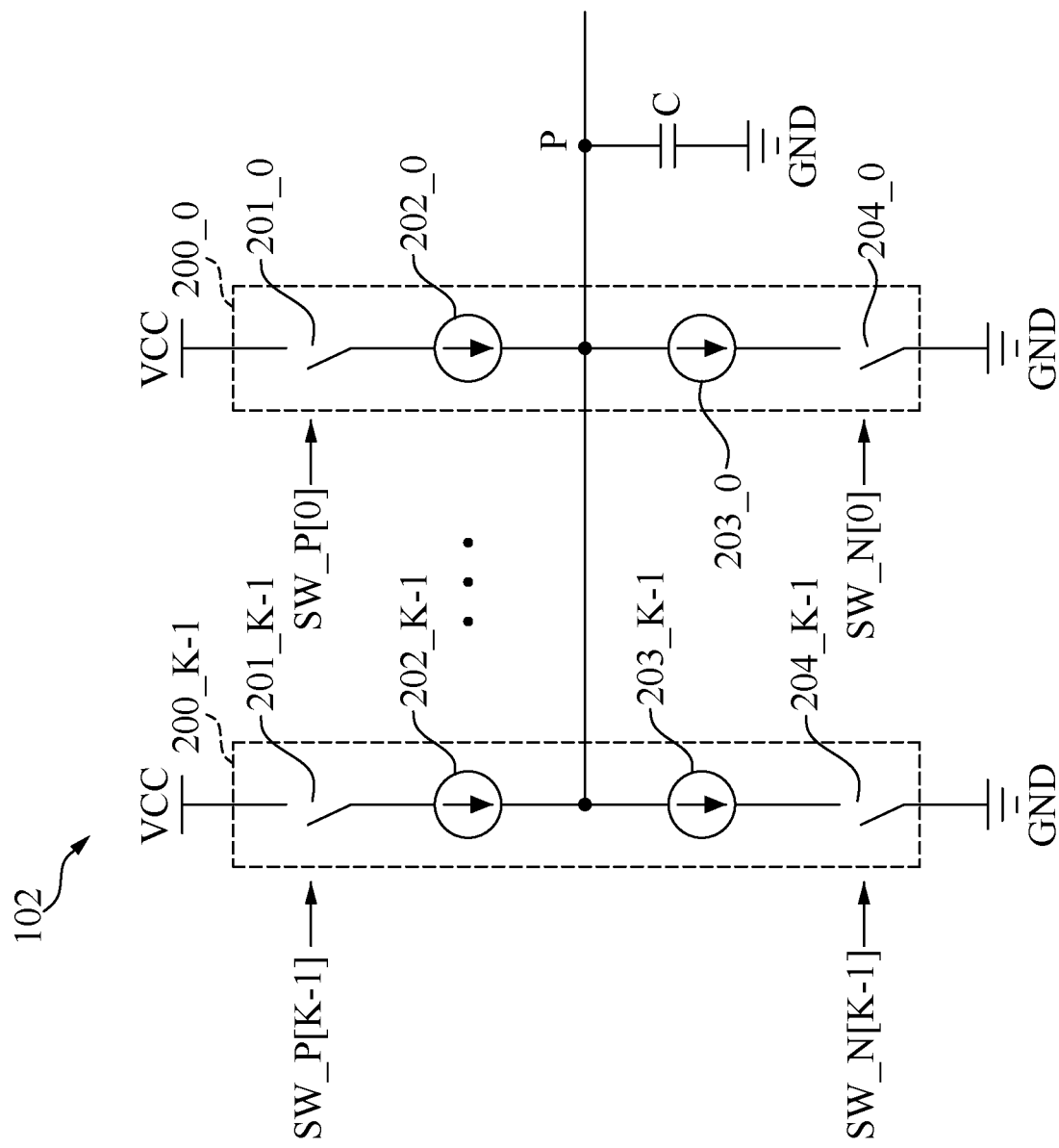
FIG. 2 is a schematic circuit diagram of a phase interpolator according to one embodiment of the present disclosure.

Reference is made to FIGS. 1 and 2, FIG. 1 is a schematic diagram of a phase interpolation device according to one embodiment of the present disclosure, and FIG. 2 is a schematic circuit diagram of a phase interpolator according to one embodiment of the present disclosure. As shown in FIGS. 1 and 2, a phase interpolation device 10 includes a digital controller circuit 101 and a phase interpolator 102. The phase interpolator 102 is electrically coupled to the digital controller circuit 101 and includes a plurality of circuit branches 200_0 to 200_K−1. A quantity of the circuit branches 200_0 to 200_K−1 is greater than or equal to N×M, that is, K≥(N×M). N is an integer greater than 1, and M is an integer greater than or equal to 1.

The circuit branches 200_0 to 200_K−1 are electrically coupled to an output node P and controlled by the digital controller circuit 101, so as to generate an n-th phase clock CKI_n−1 of N phase clocks CKI_0 to CKI_N−1 between a first input clock CLK_A and a second input clock CLK_B, and the n-th phase clock CKI_n−1 serves as an output clock of the phase interpolation device 10, where n is an integer from 1 to N. In this embodiment, a phase of the first input clock CLK_A leads a phase of the second input clock CLK_B, and the two input clocks have a phase time difference of T. Therefore, the phase time difference between any two adjacent ones of the N phase clocks CKI_0 to CKI_N−1 is T/N. Further, in the present embodiment, the phase of the first phase clock CKI_0 can be assumed as being equal to the phase of the first input clock CLK_A, but the present disclosure is not limited thereto.

Specifically, each of the circuit branches of the phase interpolator 102 includes a first current source and a second current source electrically coupled in series between a supply voltage VCC and a ground voltage GND, and the output node P is electrically coupled between the first current source and the second current source. For example, the circuit branch 200_0 of FIG. 2 includes a first current source 202_0 and a second current source 203_0 electrically coupled in series between the supply voltage VCC and the ground voltage GND, and the output node P is electrically coupled between the first current source 202_0 and the second current source 203_0, and so forth, the circuit branch 200_K−1 includes a first current source 202_K−1 and a second current source 203_K−1 electrically coupled in series between the power supply voltage VCC and the ground voltage GND, and the output node P is electrically coupled between the first current source 202_K−1 and the second current source 203_K−1. In addition, the phase interpolator 102 further includes a capacitor C electrically coupled between the output node P and the ground voltage GND.

It can be seen that the present disclosure controls the circuit branches 200_0 to 200_K−1 through the digital controller circuit 101 to sequentially use at least one first current source and at least one second current source to charge and discharge the capacitor C, and a voltage signal on the output node P is taken as the n-th phase clock CKI_n−1. More specifically, when the digital controller circuit 101 controls the circuit branches 200_0 to 200_K−1 to generate the n-th phase clock CKI_n−1, the digital controller circuit 101 controls, in response to appearances of rising edges of the first input clock CLK_A, the circuit branches 200_0 to 200_K−1 to charge the capacitor C using (N−n+1)×M ones of the first current source, and the digital controller circuit 101 controls, in response to appearances of rising edges of the second input clock CLK_B, the circuit branches 200_0 to 200_K−1 to use N×M ones of the first current source to charge the capacitor C.

In addition, when the digital controller circuit 101 controls the circuit branches 200_0 to 200_K−1 to generate the n-th phase clock CKI_n−1, the digital controller circuit 101 controls, in response to appearances of falling edges of the first input clock CLK_A, the circuit branches 200_0 to 200_K−1 to discharge the capacitor C using (N−n+1)×M ones of the first current source, and the digital controller circuit 101 controls, in response to appearances of falling edges of the second input clock CLK_B, the circuit branches 200_0 to 200_K−1 to use N×M ones of the first current source to discharge the capacitor C. For example, if N and M are 4 and 1, respectively, it means that the phase interpolator 102 can generate one of four phase clocks CKI_0 to CKI_3 interpolated between the first input clock CLK_A and the second input clock CLK_B, and the phase interpolator at least includes the circuit branches 200_0 to 200_3.

Figure 3:
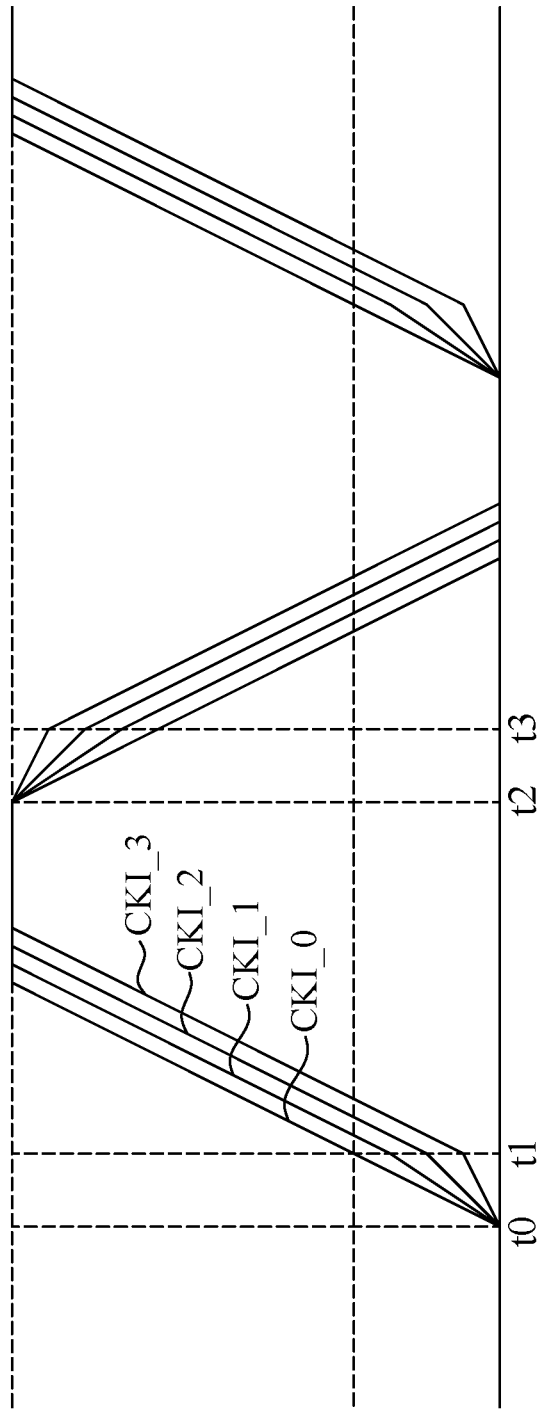
FIG. 3 is a schematic diagram of four phase clocks generated by a phase interpolator according to one embodiment of the present disclosure.
Figure 4:
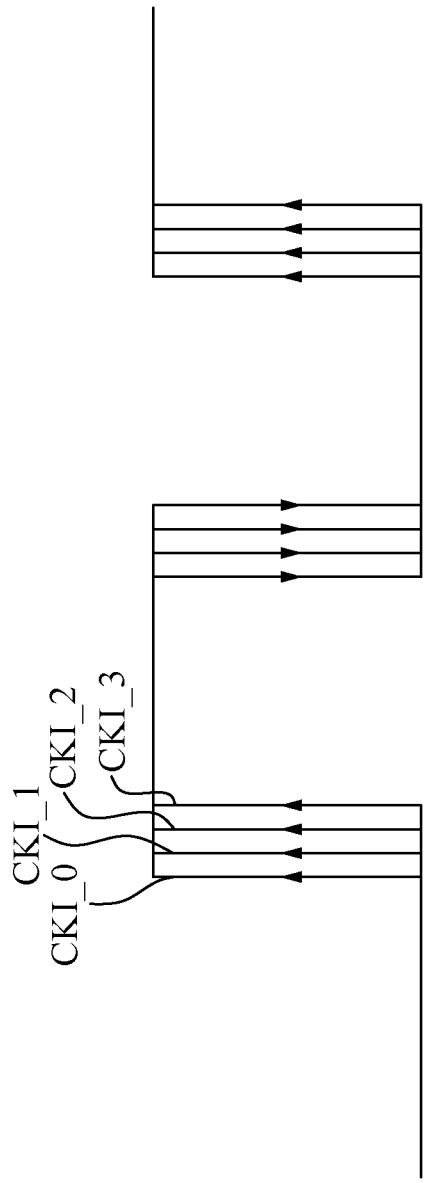
FIG. 4 is a schematic diagram of the four-phase clock pulses of FIG. 3 being converted into pulsed square waves by a buffer circuit.

Reference is made to FIGS. 3 and 4, FIG. 3 is a schematic diagram of four phase clocks generated by a phase interpolator according to one embodiment of the present disclosure, and FIG. 4 is a schematic diagram of the four-phase clock pulses of FIG. 3 being converted into pulsed square waves by a buffer circuit. For ease of understanding, FIG. 3 and FIG. 4 shows that the four phase clocks CKI_0 to CKI_3 are in the same time interval, but those skilled in the art can understand from the above that the circuit branches 200_0 to 200_3 only generate one of these four phase clocks CKI_0 to CKI_3 each time and use the generated one as the output clock of the phase interpolation device 10. In this case, in the present embodiment, time t0 and t1 are used to represent timings of the rising edges of the first input clock CLK_A and the second input clock CLK_B, respectively, and time t2 and t3 are used to represent timings of the falling edges of the first input clock CLK_A and the second input clock CLK_B, respectively.

In other words, an interval from time t0 to t1 or an interval from time t2 to t3 is the phase time difference between the first input clock CLK_A and the second input clock CLK_B. Therefore, when the digital controller circuit 101 controls the circuit branches 200_0 to 200_3 to generate the first phase clock CKI_0, the digital controller circuit 101 controls the circuit branches 200_0 to 200_3 to use four first current sources such as the first current sources 202_0 to 202_3 to charge the capacitor C from time t0, and the digital controller circuit 101 controls the circuit branches 200_0 to 200_3 to continue to charge the capacitor C with the four first current sources from time t1.

In contrast, when the digital controller circuit 101 controls the circuit branches 200_0 to 200_3 to generate the second phase clock CKI_1, the digital controller circuit 101 controls the circuit branches 200_0 to 200_3 to use three first current sources such as the first current sources 202_0 to 202_2 to charge the capacitor C from time t0, and controls the circuit branches 200_0 to 200_3 to continue to charge the capacitor C with the four first current sources such as the first current sources 202_0 to 202_3 from time t1, and so forth. When the digital controller circuit 101 controls the circuit branches 200_0 to 200_3 to generate the fourth phase clock CKI_3, the digital controller circuit 101 controls the circuit branches 200_0 to 200_3 to use one first current source such as the first current source 202_2 to charge the capacitor C from time t0, and controls the circuit branches 200_0 to 200_3 to continue to charge the capacitor C with the four first current sources from time t1. It should be understood that when the capacitor C is charged, the voltage signal on the output node P gradually increases, that is, a waveform of the rising edge of the n-th phase clock CKI_n–1 is generated, and the voltage signal at this time is proportional to the charging current.

It can be seen that between time t0 and time t1, the circuit branches 200_0 to 200_3 that generate the second phase clock CKI_1 use one less first current sources than that used by the circuit branches 200_0 to 200_3 that generate the first phase clock CKI_0 to charge the capacitor C, and so forth, the circuit branches 200_0 to 200_3 that generate the fourth phase clock CKI_3 use one less first current sources than that used by the circuit branches 200_0 to 200_3 that generate the third phase clock CKI_2 to charge capacitor C, such that conversion rates of the first output clock CKI_0, the second output clock CKI_1, the third output clock CKI_2 and the fourth output clock CKI_3 are an arithmetic progression at this time. The so-called conversion rate represents a voltage change rate per unit time.

In addition, after time t1, the circuit branches 200_0 to 200_3 that generate the second phase clock CKI_1 use four first current sources that are as the same as those used by the circuit branches 200_0 to 200_3 that generate the first phase clock CKI_0 to charge the capacitor C, and so forth, the circuit branches 200_0 to 200_3 that generate the fourth phase clock CKI_3 use four first current sources that are as the same as those used by the circuit branches 200_0 to 200_3 that generate the third phase clock CKI_2 to charge the capacitor C, such that conversion rates of the first output clock CKI_0, the second output clock CKI_1, the third output clock CKI_2 and the fourth output clock CKI_3 is a same value sequence at this time. The details of generating a waveform of the falling edges are the same as those described above, and thus repetitive descriptions are omitted hereinafter.

Therefore, between time t2 and time t3, the circuit branches 200_0 to 200_3 that generate the second phase clock CKI_1 use one less second current sources than that used by the circuit branches 200_0 to 200_3 that generate the first phase clock CKI_0 to discharge the capacitor C, and so forth, the circuit branches 200_0 to 200_3 that generate the fourth phase clock CKI_3 use one less second current sources than that used by the circuit branches 200_0 to 200_3 that generate the third phase clock CKI_2 to discharge capacitor C, such that conversion rates of the first output clock CKI_0, the second output clock CKI_1, the third output clock CKI_2 and the fourth output clock CKI_3 are an arithmetic progression at this time.

In addition, after time t3, the circuit branches 200_0 to 200_3 that generate the second phase clock CKI_1 use four second current sources that are as the same as those used by the circuit branches 200_0 to 200_3 that generate the first phase clock CKI_0 to discharge the capacitor C, and so forth, the circuit branches 200_0 to 200_3 that generate the fourth phase clock CKI_3 use four second current sources that are as the same as those used by the circuit branches 200_0 to 200_3 that generate the third phase clock CKI_2 to discharge the capacitor C, such that conversion rates of the first output clock CKI_0, the second output clock CKI_1, the third output clock CKI_2 and the fourth output clock CKI_3 is a same value sequence at this time. The phase interpolation device 10 can further include a buffer circuit 103 electrically coupled to the phase interpolator 102 to convert the n-th output clock CKI_n–1 into a corresponding pulse square wave as shown in FIG. 4, but the present disclosure does not limit a specific implementation of the buffer circuit 103. Therefore, through the above control of the circuit branches 200_0 to 200_3 by the digital controller circuit 101, the phase interpolator 102 can generate four phase clocks CKI_0 to CKI_3 with high linearity.

Furthermore, each of the circuit branches of the phase interpolator 102 can further include a first switch electrically coupled between the supply voltage VDD and the first current source and a second switch electrically coupled between the second current source and the ground voltage GND. For example, the circuit branch 200_0 of FIG. 2 can further include a first switch 201_0 electrically coupled between the supply voltage VDD and the first current source 202_0 and a second switch 204_0 electrically coupled between the second current source 203_0 and the ground voltage GND, and so forth, the circuit branch 200_K–1 can further include a first switch 201_K–1 electrically coupled between the supply voltage VDD and the first current source 202_K–1 and a second switch 203_K–1 electrically coupled between the second current source 203_K–1 and the ground voltage GND, but the present disclosure is not limited thereto.

It can be seen that the digital controller circuit 101 generates at least one control signal CS to control the circuit branches 200_0 to 200_K–1, and the at least one control signal CS can include a first control signal for controlling each of the first switches and a second control signal for controlling each of the second switches. For example, the at least one control signal CS of FIG. 2 can include a K-bit first control signal SW_P[K−1:0] and a K-bit second control signal SW_N[K−1:0]. A first bit SW_P[0] of the first control signal is used to control the first switch 201_0, and so forth, Kth bit SW_P[N−1] of the first control signal is used to control the first switch 201_K−1. However, the present disclosure is not limited thereto. In addition, a first bit SW_N[0] of the second control signal is used to control the second switch 204_0, and so forth, Kth bit SW_N[K−1] of the second control signal is used to control the second switch 204_K−1, but the present disclosure is not limited thereto.

On the other hand, the digital controller circuit 101 can control the circuit branches 200_0 to 200_K−1 to generate the n-th phase clock CKI_n−1 of the N phase clocks CKI_0 to CKI_N−1 according to a phase selection signal P_SEL. Therefore, the phase interpolation device 10 can further include a calibration circuit 104 electrically coupled to the digital controller circuit 101. The calibration circuit 104 is configured to determine whether the n-th phase clock CKI_n−1 has a position offset with respect to known reference data, and to generate the phase selection signal P_SEL. That is, the calibration circuit 104 can be configured to select the n-th phase clock CKI_n−1 as the output clock of the phase interpolation device 10.

Figure 5B:
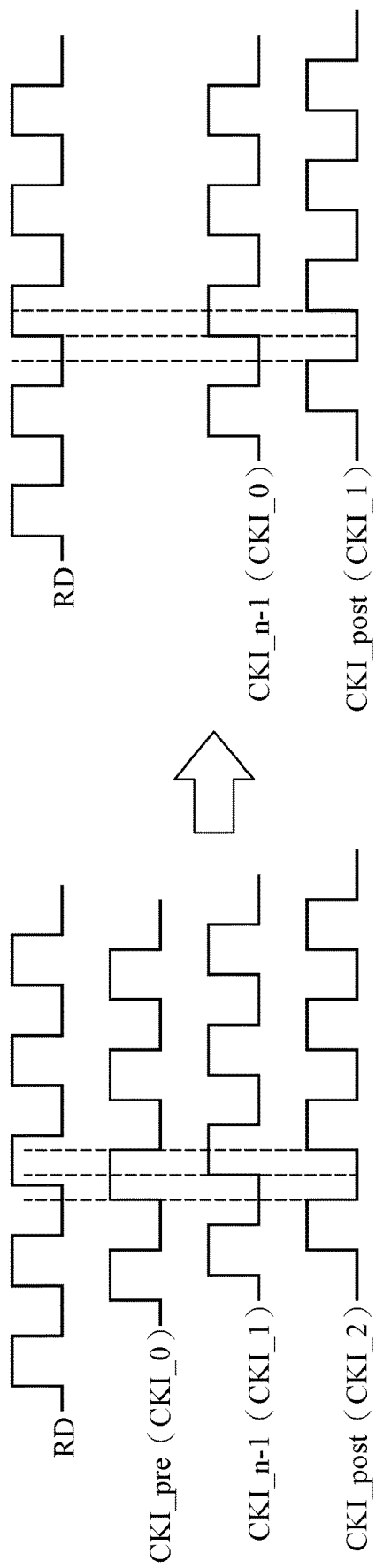
Figure 5C:
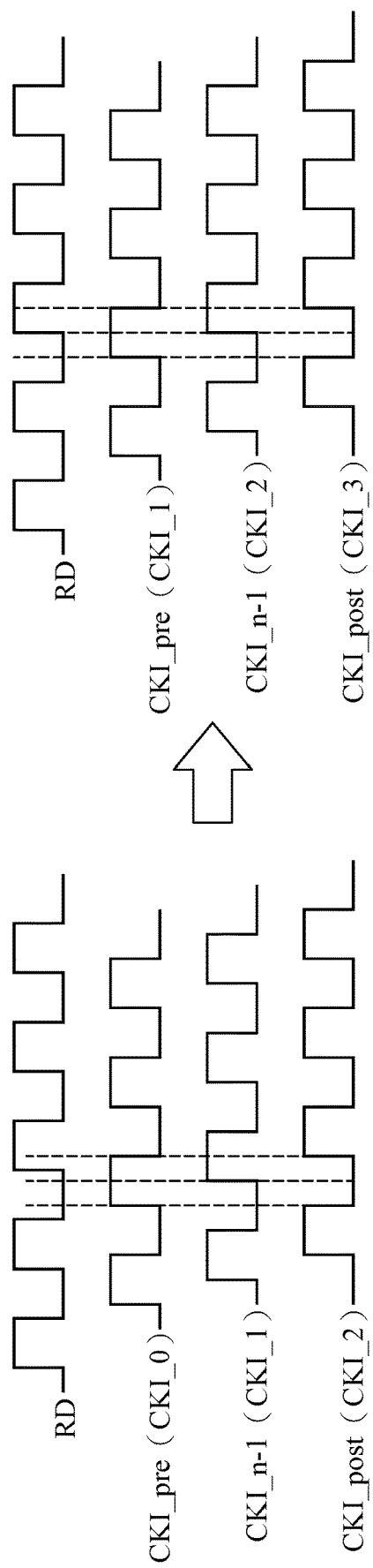

In more detailed, reference is made to FIG. 5A to FIG. 5C. FIGS. 5A to 5C are schematic diagrams showing that a calibration circuit determines whether an n-th phase clock has a position offset with respect to known reference data according to one embodiment of the present disclosure. As shown in FIG. 5A, taking the four phase clocks CKI_0 to CKI_3 of FIG. 4 as an example, assuming that the digital controller circuit 101 initially controls the circuit branches 200_0 to 200_K−1 to generate the second phase clock CKI_1 according to the phase selection signal P_SEL, which means that the n-th phase clock CKI_n−1 at this time is the second phase clock CKI_1. In addition, the calibration circuit 104 can also perform a correction by using the first phase clock CKI_0 and the third phase clock CKI_2 having phases that are ahead and behind the second phase clock CKI_1, respectively.

In the present embodiment, the first phase clock CKI_0 whose phase is ahead of the second phase clock CKI_1 can be simply referred to as a phase leading clock CKI_pre, and the third phase clock CKI_2 whose phase is behind of the second phase clock CKI_1 of the second phase clock CKI_1 can be simply referred to as a phase lagging clock CKI_post. It should be understood that since all three have the same period as reference data RD, the calibration circuit 104 can use rising edges of said three to sample the reference data RD, and the rising edge of the second phase clock CKI_1 can be expected to align with a changing edge of the reference data RD.

As shown in FIG. 5B, if the rising edge of the second phase clock CKI_1 deviates from the changing edge of the reference RD to the right, a sample result of the phase leading clock CKI_pre, the n-th phase clock CKI_n−1 and the phase lagging clock CKI_post can be [0 1 1] or [1 0 0]. According to the sample result, the calibration circuit 104 can obtain that the phase leading clock CKI_pre needs to be selected as the output clock of the phase interpolation device 10. Therefore, the calibration circuit 104 adjusts the phase selection signal P_SEL, such that the digital controller circuit 101 controls the circuit branches 200_0 to 200_K−1 to generate the first phase clock CKI_0 according to the adjusted phase selection signal P_SEL, that is, the n-th phase clock CKI_n−1 at this time is changed to the first phase clock CKI_0, and the phase lagging clock CKI_post at this time is changed to the second phase clock CKI_1. For ease of understanding, a final result of FIG. 5B assumes that the rising edge of the first phase clock CKI_0 at this time is aligned with the changing edge of the reference data RD, but the present disclosure is not limited thereto.

In contrast, as shown in FIG. 5C, if the rising edge of the second phase clock CKI_1 deviates from the changing edge of the reference RD to the left, a sample result of the phase leading clock CKI_pre, the n-th phase clock CKI_n−1 and the phase lagging clock CKI_post can be [0 0 1] or [1 1 0]. According to the sample result, the calibration circuit 104 can obtain that the phase lagging clock CKI_post needs to be selected as the output clock of the phase interpolation device 10. Therefore, the calibration circuit 104 adjusts the phase selection signal P_SEL, such that the digital controller circuit 101 controls the circuit branches 200_0 to 200_K−1 to generate the third phase clock CKI_2 according to the adjusted phase selection signal P_SEL, that is, the n-th phase clock CKI_n−1 at this time is changed to the third phase clock CKI_0, and the phase lagging clock CKI_post at this time is changed to the fourth phase clock CKI_3. For ease of understanding, a final result of FIG. 5C assumes that the rising edge of the third phase clock CKI_2 at this time is aligned with the changing edge of the reference data RD, but the present disclosure is not limited thereto.

Figure 6:
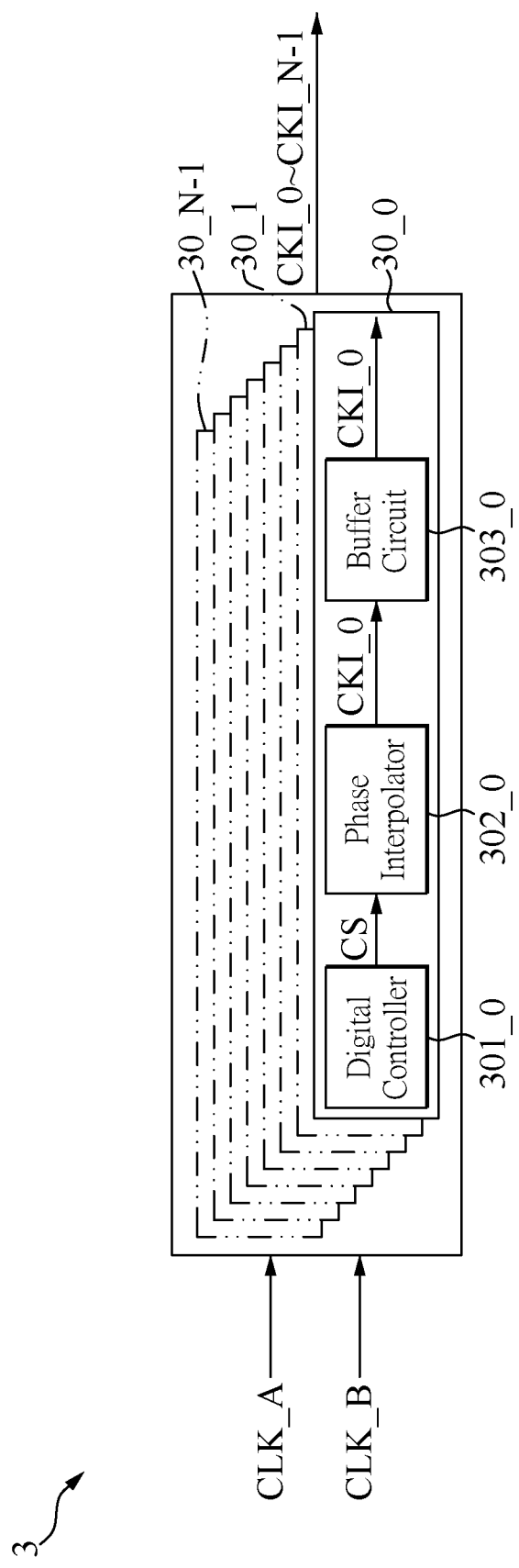
FIG. 6 is a schematic diagram of a multi-phase clock generation device according to one embodiment of the present disclosure.
Figure 7:
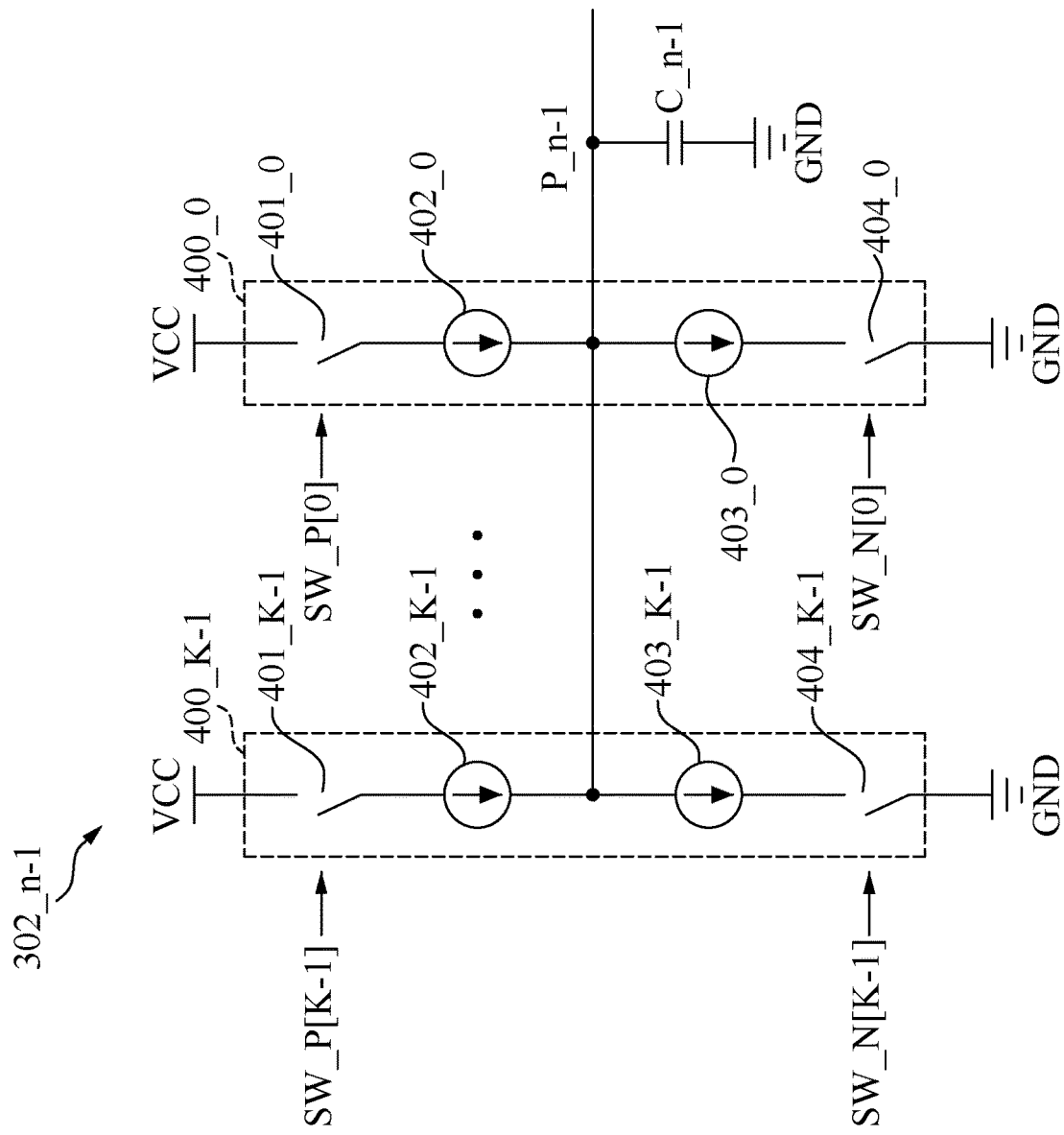
FIG. 7 is a schematic diagram of a phase interpolator utilized in the multi-phase clock generation device of FIG. 6 according to one embodiment of the present disclosure.

According to the above steps, the calibration circuit 104 can continuously calibrate the output clock of the phase interpolation device 10 according to the changing reference data RD. It should be noted that, in the above steps, falling edges of the n-th phase clock CKI_n−1 can also be used to sample the reference data RD. The details thereof are the same as those described above, and thus repetitive descriptions are omitted hereinafter. In addition, the present disclosure can further respectively utilize N phase interpolators 102 to generate N phase clocks CKI_0 to CKI_N−1 with high linearity. Reference is made to FIGS. 6 and 7, FIG. 6 is a schematic diagram of a multi-phase clock generation device according to one embodiment of the present disclosure, and FIG. 7 is a schematic diagram of a phase interpolator utilized in the multi-phase clock generation device of FIG. 6 according to one embodiment of the present disclosure.

As shown in FIG. 6, a multi-phase clock generation device 3 includes N clock generating circuits 30_0 to 30_N−1, which are respectively configured to generate N phase clocks CKI_0~CKI_N−1 interpolated between a first input clock CLK_A and a second input clock CLK_B through N output nodes P_0 to P_N−1. In this embodiment, the n-th clock generating circuit 30_n−1 is configured to generate an n-th phase clock CKI_n−1 through an n-th output node P_n−1. For example, assuming that N is still 4, it means that the multi-phase clock generation device 3 uses four clock generation circuits 30_0 to 303 to generate fourth phase clocks CKI_0 to CKI_3 interpolated between the first input clock CLK_A and the second input clock CLK_B, and the first clock generation circuit 300 is configured to generate the first phase clock CKI_0 through the first output node P_0, and so forth, the fourth clock generation circuit 30_3 is configured to generate the fourth phase clock CKI_3 through the fourth output node P_3.

According to the above disclosure, those skilled in the art can understand that the N clock generating circuits 30_0 to 30_N−1 in FIG. 6 use N phase interpolators 102 to generate the N phase clocks CKI_0 to CKI_N−1. Therefore, the n-th clock generating circuit 30_n-1 includes a digital controller circuit 301_n-1 and a phase interpolator 302_n-1, but for convenience of presentation, FIG. 6 only illustrates a digital controller circuit 301_0 and a phase interpolator 302_0 of the first clock generating circuit 30_0. Similarly, the phase interpolator 302_n-1 is electrically coupled to the digital controller circuit 301_n-1, and includes a plurality of circuit branches 400_0 to 400_K-1. The circuit branches 400_0 to 400_K-1 of the phase interpolator 302_n-1 are electrically coupled to the n-th output node P_n-1 and controlled by the digital controller circuit 301_n-1 to generate the n-th phase clock CKI_n-1 on the n-th output node P_n-1.

As shown in FIG. 7, each of the circuit branches of the phase interpolator 302_n-1 includes a first current source and a second current source electrically coupled in series between the supply voltage VCC and the ground voltage GND, and the n-th output node P_n-1 is electrically coupled between the first current source and the second current source of the phase interpolator 302_n-1. For example, the circuit branch 400_0 of the phase interpolator 302_n-1 includes a first current source 402_0 and a second current source 403_0 electrically coupled in series between the supply voltage VCC and the ground voltage GND, and the n-th output node P_n-1 is electrically coupled between the first current source 402_0 and the second current source 403_0 of the phase interpolator 302_n-1, and so forth, the circuit branch 400_K-1 of the phase interpolator 302_n-1 includes a first current source 402_K-1 and a second current source 403_K-1 electrically coupled in series between the power supply voltage VCC and the ground voltage GND, and the n-th output node P_n-1 is electrically coupled between the first current source 402_K-1 and the second current source 403_K-1 of the phase interpolator 302_n-1. In addition, the phase interpolator 302_n-1 further includes a capacitor C_n-1 electrically coupled between the n-th output node P_n-1 and the ground voltage GND.

Since the details of the digital controller circuit 301_0 and the phase interpolator 302_n-1 are the same as those described above, repetitive descriptions are omitted hereinafter. Therefore, in the n-th clock generation circuit 30_n-1, the digital controller circuit 301_n-1 controls, in response to appearances of rising edges of the first input clock CLK_A, the circuit branches 400_0 to 400_K-1 of the phase interpolator 302_n-1 to charge the capacitor C_n-1 with (N-n+1)×M ones of the first current source, and controls, in response to appearances of rising edges of the second input clock CLK_B, the circuit branches 400_0~400_K of the phase interpolator 302_n-1 to charge the capacitor C_n-1 with N×M ones of the first current source. In addition, in the n-th clock generation circuit 30_n-1, the digital controller circuit 301_n-1 controls, in response to appearances of falling edges of the first input clock CLK_A, the circuit branches 400_0 to 400_K-1 of the phase interpolator 302_n-1 to discharge the capacitor C_n-1 with (N-n+1)×M ones of the second current source, and controls, in response to appearances of falling edges of the second input clock CLK_B, the circuit branches 400_0~400_K of the phase interpolator 302_n-1 to discharge the capacitor C_n-1 with N×M ones of the second current source.

Similarly, the n-th clock generation circuit 30_n-1 can further include a buffer circuit 303_n-1 electrically coupled to the phase interpolator 302_n-1, and is configured to convert the n-th output clock CKI_n-1 into a corresponding pulse square wave. Therefore, the multi-phase clock generation device 3 can respectively use N phase interpolators 302_n-1 to generate N phase clocks CKI_0 to CKI_N-1 with high linearity. In addition, in the n-th clock generation circuit 30_n-1, each of the circuit branches of the phase interpolator 302_n-1 can further include a first switch electrically coupled between the supply voltage VDD and the first current source, and a second switch electrically coupled between the second current source and the ground voltage GND. For example, the circuit branch 400_0 of the phase interpolator 302_n-1 can further include a first switch 401_0 electrically coupled between the supply voltage VDD and the first current source 402_0, and a second switch 404_0 electrically coupled between the second current source 403_0 and the ground voltage GND, and so forth, the circuit branch 400_K-1 of the phase interpolator 302_n-1 can further include a first switch 401_K-1 electrically coupled between the supply voltage VDD and the first current source 402_K-1, and a second switch 404_K-1 electrically coupled between the second current source 403_K-1 and the ground voltage GND, but the present disclosure is not limited thereto.

It can be seen that, in the n-th clock generation circuit 30_n-1, the digital controller circuit 301_n-1 generates at least one control signal CS to control the circuit branches 400_0 to 400_K-1 of the phase interpolator 302_n-1, and the at least one control signal CS can include a first control signal for controlling each of the first switches and a second control signal for controlling each of the second switches. For example, the at least one control signal CS of FIG. 7 can include a K-bit first control signal SW_P[K-1:0] and a K-bit second control signal SW_N[K-1:0].

A first bit SW_P[0] of the first control signal is used to control the first switch 401_0, and so forth, Kth bit SW_P[N-1] of the first control signal is used to control the first switch 401_K-1. However, the present disclosure is not limited thereto. In addition, a first bit SW_N[0] of the second control signal is used to control the second switch 404_0, and so forth, Kth bit SW_N[K-1] of the second control signal is used to control the second switch 404_K-1, but the present disclosure is not limited thereto. Since the details thereof are the same as those described above, repetitive descriptions are omitted hereinafter.

In conclusion, in the phase interpolation device and the multi-phase clock generation device provided by the present disclosure, the plurality of circuit branches of the phase interpolator can be controlled by the digital controller circuit to sequentially utilize a specific number of first current sources and a specific number of second current sources to charge and discharge the capacitor to generate a phase clock with high linearity.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:
1. A device, comprising:
a digital controller circuit; and
a phase interpolator electrically coupled to the digital controller circuit and including:

a plurality of circuit branches electrically coupled to an output node and controlled by the digital controller circuit to generate an n-th phase clock of N phase clocks between a first input clock and a second input clock, wherein the n-th phase clock serves as an output clock, N is an integer greater than 1, and n is an integer from 1 to N;

wherein each of the plurality of circuit branches includes a first current source and a second current source electrically coupled in series between a supply voltage and a ground voltage, the output node is electrically coupled between the first current source and the second current source, and the phase interpolator further includes a capacitive circuit electrically coupled between the output node and the ground voltage;

wherein a quantity of the plurality of circuit branches is greater than or equal to N×M, M is an integer greater than or equal to 1, and when the digital controller circuit controls the circuit branches to generate the n-th phase clock, the digital controller circuit controls, in response to appearances of rising edges of the first input clock, the plurality of circuit branches to charge the capacitive circuit with (N−n+1)×M ones of the first current source, and the digital controller circuit controls, in response to appearances of rising edges of the second input clock, the plurality of circuit branches to charge the capacitive circuit with N×M ones of the first current source.

2. The device according to claim 1, wherein, when the digital controller circuit controls the plurality of circuit branches to generate the n-th phase clock, the digital controller circuit further controls, in response to appearances of falling edges of the first input clock, the plurality of circuit branches to discharge the capacitive circuit using (N−n+1)×M ones of the second current source, and the digital controller circuit further controls, in response to appearances of falling edges of the second input clock, the plurality of circuit branches to use N×M ones of the second current source to discharge the capacitive circuit.

3. The device according to claim 2, wherein each of the plurality of circuit branches further includes a first switch electrically coupled between the supply voltage and the first current source, and a second switch electrically coupled between the second current source and the ground voltage.

4. The device according to claim 3, wherein the digital controller circuit generates at least one control signal to control the plurality of circuit branches, the at least one control signal includes a first control signal and a second control signal, the first control signal is used to control the first switch of each of the plurality of circuit branches, and the second control signal is used to control the second switch of each of the plurality of circuit branches.

5. The device according to claim 2, wherein the digital controller circuit controls the plurality of circuit branches to generate the n-th phase clock according to a phase selection signal, and the device further comprises:

a calibration circuit electrically coupled to the digital controller circuit, wherein the calibration circuit is configured to determine whether the n-th phase clock has a position offset with respect to known reference data, and to generate the phase selection signal.

6. A multi-phase clock generation device, comprising:

N clock generating circuits respectively configured to generate N phase clocks interpolated between a first input clock and a second input clock through N output nodes, wherein an n-th clock generating circuit of the N clock generating circuits is configured to generate an n-th phase clock of the N phase clocks through an n-th output node of the N output nodes, and the n-th clock generating circuit includes:

a digital controller circuit; and a phase interpolator electrically coupled to the digital controller circuit and including:

a plurality of circuit branches electrically coupled to the n-th output node and controlled by the digital controller circuit to generate the n-th phase clock at the n-th output node, wherein N is an integer greater than 1, and n is an integer from 1 to N;

wherein in the n-th clock generating circuit, each of the plurality of circuit branches includes a first current source and a second current source electrically coupled in series between a supply voltage and a ground voltage, the n-th output node is electrically coupled between the first current source and the second current source, and the phase interpolator further includes a capacitive circuit electrically coupled between the n-th output node and the ground voltage;

wherein, in the n-th clock generating circuit, a quantity of the plurality of circuit branches is greater than or equal to N×M, M is an integer greater than or equal to 1, and the digital controller circuit controls, in response to appearances of rising edges of the first input clock, the plurality of circuit branches to charge the capacitive circuit with (N−n+1)×M ones of the first current source, and the digital controller circuit controls, in response to appearances of rising edges of the second input clock, the plurality of circuit branches to charge the capacitive circuit with N×M ones of the first current source.

7. The multi-phase clock generation device according to claim 6, wherein, in the n-th clock generating circuit, the digital controller circuit further controls, in response to appearances of falling edges of the first input clock, the plurality of circuit branches to discharge the capacitive circuit using (N−n+1)×M ones of the second current source, and the digital controller circuit further controls, in response to appearances of falling edges of the second input clock, the plurality of circuit branches to use N×M ones of the second current source to discharge the capacitive circuit.

8. The multi-phase clock generation device according to claim 7, wherein, in the n-th clock generating circuit, each of the plurality of circuit branches further includes a first switch electrically coupled between the supply voltage and the first current source, and a second switch electrically coupled between the second current source and the ground voltage.

9. The multi-phase clock generation device according to claim 8, wherein, in the n-th clock generating circuit, the digital controller circuit generates at least one control signal to control the plurality of circuit branches, the at least one control signal includes a first control signal and a second control signal, the first control signal is used to control the first switch of each of the plurality of circuit branches, and the second control signal is used to control the second switch of each of the plurality of circuit branches.

10. The multi-phase clock generation device according to claim 6, wherein a phase of the first input clock leads a phase of the second input clock, and any two adjacent ones of the N phase clocks have the same phase difference therebetween.

* * * * *